(12) United States Patent
Dedieu et al.

(10) Patent No.: US 9,998,178 B2
(45) Date of Patent: Jun. 12, 2018

(54) METHOD OF CONTACTLESS COMMUNICATION BETWEEN AN OBJECT AND A READER BY ACTIVE LOAD MODULATION

(71) Applicant: STMicroelectronics SA, Montrouge (FR)

(72) Inventors: Sebastien Dedieu, La Terrasse (FR); Marc Houdebine, Crolles (FR)

(73) Assignee: STMicroelectronics SA, Montrouge (FR)

( * ) Notice: Subject to any disclaimer, the term of this patent is extended or adjusted under 35 U.S.C. 154(b) by 0 days. days.

(21) Appl. No.: 15/436,826

(22) Filed: Feb. 19, 2017

(65) Prior Publication Data

US 2018/0034505 A1 Feb. 1, 2018

(30) Foreign Application Priority Data

Jul. 27, 2016 (FR) ...................... 16 57226

(51) Int. Cl.
*H04B 5/00* (2006.01)
*H03L 7/099* (2006.01)
(Continued)

(52) U.S. Cl.
CPC ....... *H04B 5/0031* (2013.01); *G06K 7/10297* (2013.01); *H03L 7/081* (2013.01);
(Continued)

(58) Field of Classification Search
None
See application file for complete search history.

(56) References Cited

U.S. PATENT DOCUMENTS

| 5,917,351 A * | 6/1999 | Shiue | H03L 7/087 327/156 |
| 2009/0195277 A1* | 8/2009 | Yamakido | H03L 7/085 327/158 |

(Continued)

FOREIGN PATENT DOCUMENTS

| EP | 2431926 A1 | 3/2012 |
| EP | 2680457 A2 | 1/2014 |
| EP | 2843840 A1 | 3/2015 |

OTHER PUBLICATIONS

Gebhart, M. et al., "Active Load Modulation for Contactless Near-Field Communication," IEEE 2012 International Conference on RFID—Technologies and Applications, Nov. 5-7, 2012, pp. 228-233.

*Primary Examiner* — Mohammed Rachedine
(74) *Attorney, Agent, or Firm* — Slater Matsil, LLP

(57) ABSTRACT

A method can be used for contactless communication of an object with a reader using active load modulation. A main clock signal is generated within the object. The generating includes a calibration phase and a transmission phase. The calibration phase includes locking an output signal of a controlled main oscillator onto a phase and frequency of a secondary clock signal received from the reader and estimating a frequency ratio between a frequency of the output signal of the main oscillator and a reference frequency of a reference signal originating from a reference oscillator. The transmission phase includes only frequency-locking the output signal of the main oscillator onto the frequency of the reference signal corrected by the estimated frequency ratio.

21 Claims, 16 Drawing Sheets

(51) Int. Cl.
*H03L 7/093* (2006.01)
*H03L 7/081* (2006.01)
*G06K 7/10* (2006.01)

(52) U.S. Cl.
CPC .............. *H03L 7/093* (2013.01); *H03L 7/099* (2013.01); *H04B 5/0056* (2013.01); *H04B 5/0093* (2013.01)

(56) References Cited

U.S. PATENT DOCUMENTS

| | | | |
|---|---|---|---|
| 2011/0025424 A1* | 2/2011 | Miyanaga | H03C 3/0941 331/10 |
| 2016/0142113 A1 | 5/2016 | Gaethke et al. | |

\* cited by examiner

METHOD OF CONTACTLESS COMMUNICATION BETWEEN AN OBJECT AND A READER BY ACTIVE LOAD MODULATION

CROSS-REFERENCE TO RELATED APPLICATIONS

This application claims priority to French Patent Application No. 1657226, filed on Jul. 27, 2016, which application is hereby incorporated herein by reference.

TECHNICAL FIELD

Embodiments of the invention relate to method of contactless communication between an object and a reader by active load modulation.

BACKGROUND

Near field communication, more commonly referred to by the person skilled in the art as "NFC," is a wireless connectivity technology which that a communication over a short distance, for example 10 cm, between electronic devices, such as, for example, contactless chip cards or mobile telephones in card-emulation mode, and readers.

NFC technology is particularly suitable for connecting any type of user device and allows fast and simple communications.

A contactless object is an object capable of exchanging information via an antenna with another contactless object, for example a reader, according to a contactless communication protocol.

An NFC object, which is a contactless object, is an object compatible with NFC technology.

NFC technology is an open technology platform standardized in the ISO/IEC 18092 and ISO/IEC 21481 standards, but incorporating many existing standards, such as, for example, the type A and type B protocols defined in the ISO-14443 standard, which may be communication protocols usable in NFC technology.

Apart from its conventional telephony function, a mobile cellular telephone can be used (if it is equipped with specific means) to exchange information with another contactless device, for example a contactless reader, by using a contactless communication protocol usable in NFC technology.

This allows information to be exchanged between the contactless reader and secure elements located in the mobile telephone. Many applications are thus possible, such as mobile ticketing in public transport (the mobile telephone acts as a transport ticket) or mobile payment (the mobile telephone acts as payment card).

During a transmission of information between a reader and an object in card-emulation mode or tag-emulation mode, the reader generates via its antenna a magnetic field which, in the standards conventionally used, is generally a 13.56 MHz sine wave. The strength of the magnetic field is between 0.5 and 7.5 amperes/metre RMS (Root Mean Square).

Two modes are then possible, a passive mode and an active mode.

In the passive mode, only the reader generates the magnetic field and the object, in card-emulation mode or tag-emulation mode, is then passive and always acts as the target.

More precisely, the antenna of the tag-emulating or card-emulating object modulates the field generated by the reader.

This modulation is carried out by modifying the load connected to the terminals of the antenna of the object.

By modifying the load on the terminals of the antenna of the object, the output impedance of the antenna of the reader changes due to the magnetic coupling between the two antennas. This results in a change in the amplitudes and/or phases of the voltages and currents present in the antennas of the reader and the object.

And, in this way, the information to be transmitted from the object to the reader is transmitted by way of load modulation on the antenna currents of the reader.

The load variation performed during the load modulation manifests itself as an amplitude modulation and/or phase modulation of the signal (voltage or current) in the antenna of the reader. A copy of the antenna current is generated and injected into the receiving chain of the reader where this current is demodulated and processed in such a way as to extract the transmitted information.

In the active mode of operation, the reader and the object in card-emulation mode both generate an electromagnetic field. This mode of operation is generally used when the object is provided with its own power source, for example a battery, as in the case of a mobile cellular telephone which is then in card-emulation mode.

Each of the NFC devices transmits the data by using a modulation scheme, typically an ASK ("Amplitude Shift Keying") scheme.

Here also, the modulation manifests itself as a load modification and this is then referred to as communication by way of active load modulation.

Compared with a passive communication mode, greater operating distances are obtained which may extend to 20 cm according to the protocol that is used.

Furthermore, the use of active load modulation allows the use of smaller antennas.

However, this type of communication using active load modulation poses other problems.

In fact, during the active communication periods of the device in card-emulation mode, the electromagnetic field of the reader is not directly observable. This may result in a non-synchronous response of the object in card-emulation mode and therefore in a signal received by the reader having a phase shift, particularly during long periods of transmission by the device in card-emulation mode.

Thus, if two independent devices are considered, i.e. the reader and an object in card-emulation mode, capable of contactless communication by way of active load modulation, a need consequently exists to minimize or even eliminate this phase shift.

SUMMARY

Embodiments of the invention relate to wireless communication between a reader and an object, for example, but in a non-limiting manner, a mobile telephone in card-emulation mode, in particular an NFC ("Near Field Communication") object and, more particularly, compensation for a phase shift between the signal transmitted by the object and the signal received from the reader during a communication by way of Active Load Modulation (ALM).

According to one aspect, a method is proposed for contactless communication of an object with a reader by active load modulation.

The method according to this aspect includes a first communication mode comprising a generation of a main clock signal within the object, including a calibration phase and a transmission phase.

The calibration phase comprises a locking of the output signal of a controlled main oscillator (this main oscillator may be voltage-controlled or numerically controlled) onto the phase and frequency of a secondary clock signal received from the reader, and an estimation of a frequency ratio between the output frequency of the main oscillator and a reference frequency of the reference signal originating from a reference oscillator.

This reference oscillator, separate from the controlled main oscillator, delivers a reference signal, the reference frequency of which may be identical to or different from that of the output signal of the main oscillator.

Furthermore, the transmission phase comprises only a frequency-locking of the output signal of the main oscillator onto the frequency of the reference signal corrected by the estimated ratio.

The main clock signal then originates from the output signal of the main oscillator, for example, but not necessarily, by way of a frequency division.

Thus, during the calibration phase, the main oscillator is phase-locked and frequency-locked onto the signal received from the reader. Then, during a phase of transmission of information from the object to the reader, the clock signal delivered by the object, which, by way of an amplitude or phase modulation, will allow the data to be transmitted to the reader, is frequency-locked onto the frequency of the reference oscillator by way of the estimated frequency ratio (which ultimately manifests itself as a main clock signal having the desired frequency, for example 13.56 MHz), and this phase-locking alone does not modify the phase of the main clock signal which had been pre-adjusted to the phase of the signal received by the reader in the calibration phase.

Any phase shift between the clock signal received from the reader and the clock signal transmitted by the object is consequently minimized or even eliminated.

A plurality of possibilities exist for estimating the frequency ratio between the frequency of the output signal of the main oscillator and the reference signal of the reference oscillator originating from the reference oscillator.

Sliding measurements can be carried out, for example, between the frequency of the output signal of the main oscillator and the reference frequency. The method described in the French patent application filed under number 15 61153 and corresponding to the U.S. patent application Ser. No. 15/139,801, for example, can be used for this purpose.

Alternatively, the locking of the output signal of the main oscillator during the calibration phase can be performed within a phase-locked loop and the estimation of the frequency ratio can then be carried out within a frequency-locked loop using an adaptive filter connected to the output of the loop filter of the phase-locked loop and looped back onto the loop filter of the frequency-locked loop, the output word of the adaptive filter forming a control word for the frequency-locked loop, the two loop filters having the same cut-off frequency.

Thus, according to one embodiment, during the transmission phase, the loop filter of the phase-locked loop can be disconnected from the main oscillator, the output of the adaptive filter is locked and the output signal of the main oscillator is only frequency-locked onto the frequency of the reference signal corrected by the output word of the adaptive filter, which represents the frequency ratio.

According to another possible variant, the locking of the output signal of the main oscillator during the calibration phase can be carried out within a phase-locked loop and the estimation of the frequency ratio can be carried out by a system comprising the phase-locked loop and a frequency-locked loop using an integrating stabilising filter, the output of which forms a control word for the frequency-locked loop, the integrating stabilising filter being connected to the input of the loop filter of the frequency-locked loop. The loop filter of the phase-locked loop comprises the integrating stabilising filter and the loop filter of the frequency-locked loop.

Thus, according to one embodiment, during the transmission phase, the phase-locked loop is opened, the output of the integrating stabilising filter is locked and the output signal of the main oscillator is only frequency-locked onto the frequency of the reference signal corrected by the control word of the integrating stabilising filter, which again represents the frequency ratio.

It is also possible for the method to include a second communication mode comprising a generation of the main clock signal within the object, including only a locking of the output signal of the controlled main oscillator onto the phase and frequency of the secondary clock signal received from the reader.

This second communication mode corresponds, for example, to an alternation of closures of the phase-locked loop on the signal received from the reader and freewheeling of the controlled main oscillator (openings of the loop) during the transmission of the field by the object.

Whereas the aforementioned first communication mode is particularly advantageous when the periods of transmission by the object in card-emulation mode are long, since, as explained above, it allows the phase shift to be minimized or even eliminated, the second communication mode can be used, for example, during shorter transmission periods since such short periods do not result in a significant phase shift.

The method may also include a generation of the main clock signal phase-modulated by way of a Phase Shift Keying (PSK).

According to a different aspect, an object is proposed that is capable of contactless communication with a reader by way of active load modulation, including a processor. A signal generation circuit is configured to generate a main clock signal from the output signal of a controlled main oscillator. The signal generation circuit comprises a first locking circuit configured to perform a locking of the output signal of the main oscillator onto the phase and frequency of a secondary clock signal received from the reader. In estimation circuit is configured to perform an estimation of a frequency ratio between the frequency of the output signal of the main oscillator and a reference frequency of a reference signal originating from a reference oscillator. A second locking circuit is configured to perform only a frequency-locking of the output signal of the main oscillator onto the frequency of the reference signal corrected by the estimated ratio. A control circuit is configured to activate first of all the first controller and the estimation circuit, then to activate the second locking circuit.

According to one variant, the first locking circuit comprises a phase-locked loop comprising the main oscillator. The estimation circuit is configured to perform sliding measurements between the frequency of the output signal of the main oscillator and the reference frequency and a storage circuit configured to store the estimated frequency ratio. The second locking circuit comprises a frequency-locked loop comprising the main oscillator, a reference input to receive the reference signal and configured to receive the content of the storage circuit as a control word.

According to a different variant, the first locking circuit comprises a phase-locked loop comprising the main oscillator and a first loop filter. The estimation circuit comprises a frequency-locked loop having a reference input to receive the reference signal, a second loop filter, an adaptive filter connected to the output of the first loop filter and looped back onto the second loop filter. The output word of the adaptive filter forms a control word for the frequency-locked loop. The two loop filters having the same cut-off frequency.

According to one embodiment, the control circuit is configured to disconnect the main oscillator from the first loop filter in such a way as to deactivate the phase-locked loop, lock the output of the adaptive filter and connect the output of the adaptive filter to the frequency-locked loop in such a way as to only frequency-lock the output signal of the main oscillator onto the frequency of the reference signal corrected by the output word of the adaptive filter.

According to a different variant, the first locking circuit comprises a phase-locked loop comprising the main oscillator. The estimation circuit comprises a frequency-locked loop having a reference input to receive the reference signal, a loop filter, an integrating stabilising filter connected to the input of the loop filter, the output of the integrating stabilising filter forming a control word for the frequency-locked loop. The phase-locked loop has a loop filter comprising the integrator and stabiliser and the loop filter of the frequency-locked loop.

According to one embodiment, the control circuit is configured to open the phase-locked loop in such a way as to deactivate the phase-locked loop, lock the output of the integrating stabilising filter and connect the output of the integrating and stabilising filter to the frequency-locked loop in such a way as to only frequency-lock the output signal of the main oscillator onto the frequency of the reference signal corrected by the output word of the integrating stabilising filter, which corresponds to the control of this frequency-locked loop.

According to one embodiment, the control circuit is further configured, for example in a second communication mode, to activate only the phase-locked loop in such a way as to allow a generation of the main clock signal within the object, including only a locking of the output signal of the controlled main oscillator onto the phase and frequency of the secondary clock signal received from the reader.

According to one embodiment, the processor comprises an amplitude modulator configured to apply an amplitude modulation to the generated main clock signal.

According to one embodiment, the signal generation circuit comprises a phase modulator configured to apply a phase modulation of the phase shift keying type before the delivery of the main clock signal.

According to one embodiment, the phase modulator is configured to inject the phase modulation on either side of the loop filter(s) of the phase-locked loop and/or of the frequency-locked loop.

The object may, for example, be a mobile cellular telephone in card-emulation mode.

BRIEF DESCRIPTION OF THE DRAWINGS

Other advantages and characteristics of the invention will become clearer from a reading of the detailed description of embodiments, which are in no way limiting, and the attached drawings, in which.

DETAILED DESCRIPTION OF ILLUSTRATIVE EMBODIMENTS

Figure 1:
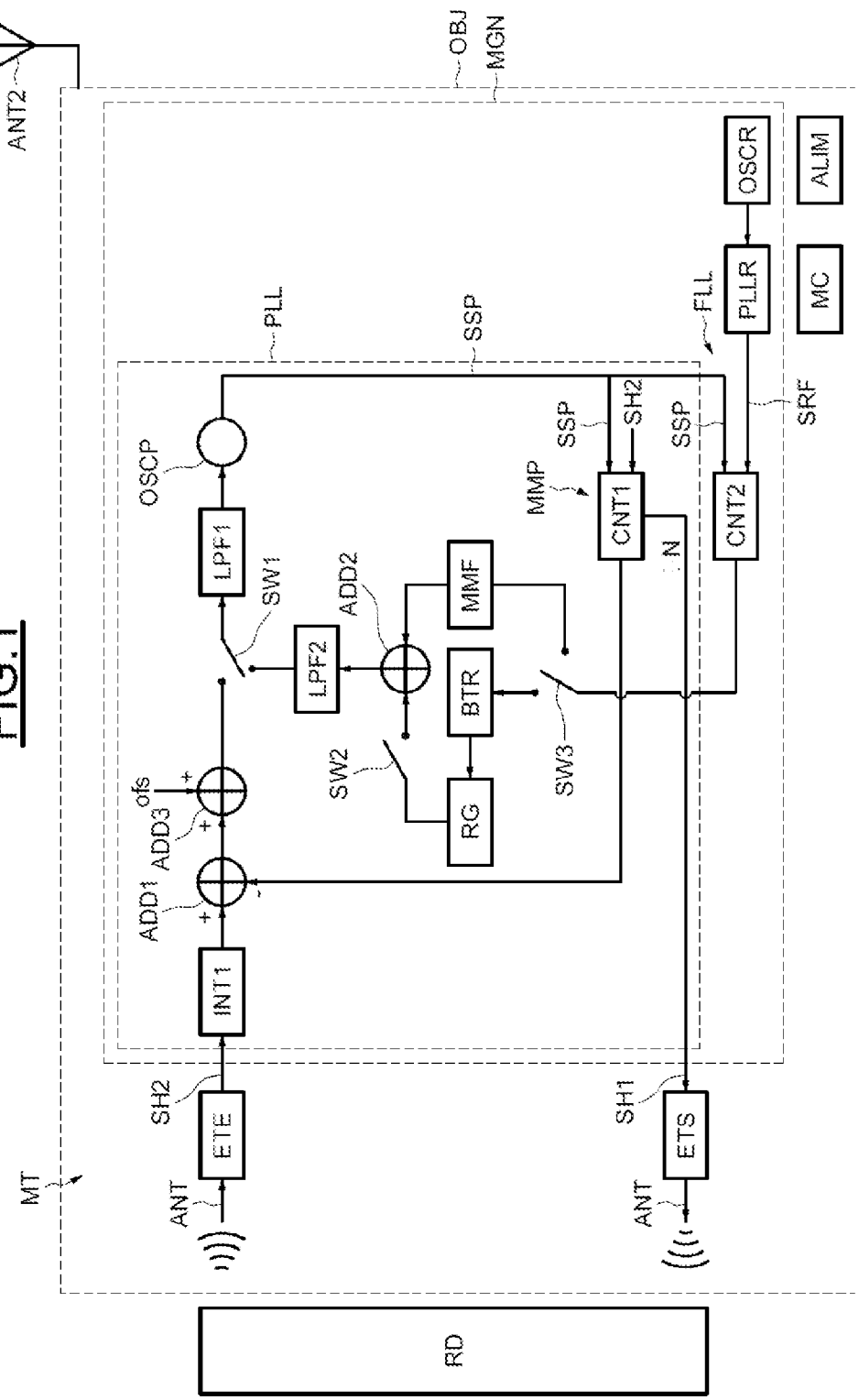
FIGS. 1 to 20 show schematically different embodiments of the invention.

In FIG. 1, the reference OBJ denotes an object, for example a mobile cellular telephone, comprising an antenna ANT2 for telephony communications. This telephone also includes a processor MT that is capable of managing a contactless communication via another antenna ANT, for example, an inductive coil, with a reader RD by way of active load modulation.

In this case, the telephone OBJ is consequently in card-emulation mode and comprises its own power supply ALIM, for example a battery, allowing it to generate its own electromagnetic field through the antenna ANT during the active load modulation.

Here, the processor also includes the antenna ANT, a reception input stage, having a conventional structure known per se, delivering a clock signal SH2 received from the reader RD.

The processor also includes an output stage ETS connected to the antenna ANT for the purpose of modulating the electromagnetic field on the basis of a clock signal SH1 during a transmission phase.

The signal SH1 is referred to below as the "main clock signal", whereas the signal SH2 is referred to as the "secondary clock signal."

Furthermore, for the sake of simplification, although two antennas ANT have been shown coupled to the stage ETE and to the stage ETS respectively, this actually involves the same antenna ANT.

The processor MT also comprises a signal generation circuit MGN configured to generate the main clock signal SH1 from the output signal SSP of a main oscillator OSP. Here, this oscillator OSP is a numerically controlled oscillator, but it could also be a voltage-controlled oscillator.

Generally speaking, the signal generation circuit comprises a first locking circuit that is configured to perform a locking of the output signal SSP of the main oscillator onto the phase and frequency of the secondary clock signal SH2 received from the reader.

The signal generation circuit MGN also includes an estimation circuit configured to perform an estimation of a frequency ratio between the frequency FRP of the output signal SSP of the main oscillator OSCP and a reference frequency FRF of a reference signal SRF originating from a reference oscillator OSCR. In the example described here, a phase-locked loop PLLR is associated with the oscillator OSCR.

The signal generation circuit MGN also comprises a second locking circuit that is configured to perform only a frequency-locking of the output signal SSP of the main oscillator onto the frequency of the reference signal SRF corrected by the estimated ratio FRP/FRF.

Furthermore, control circuit MC is configured, in a first communication mode, to activate first of all the first locking circuit and the estimation circuit during a calibration phase, then to activate the second locking circuit during a transmission phase.

A number of embodiments are possible for implementing these different circuits.

FIG. 1 shows one of these embodiments.

More precisely, here, the first locking circuit comprises a phase-locked loop PLL comprising an integrator INT1, a loop filter LPF1, the main oscillator OSCP as well as phase-measurement circuit MMP here comprising a counter CNT1 receiving, on the one hand, the output signal SSP of the main oscillator and the secondary clock signal SH2 received from the reader.

The output of the counter CNT1 is looped back onto the output of the integrator INT1 via an adder ADD1.

In the text below, and expressed in loose terms compared with the language normally used by the person skilled in the art, the term "adder" encompasses the "summation" function or the "subtraction" function, according to the +or − signs appearing at the inputs of the adder.

Furthermore, optionally, an adder ADD3 allows a phase shift ofs to be added, representing the phase shift caused by a phase shifter disposed between the antenna and the phase-locked loop.

The estimation circuit is configured to perform sliding measurements between the frequency FRP of the output signal SSP of the main oscillator OSCP and the reference frequency FRF of the reference signal SRF, as well as a storage circuit, for example a register RG, configured to store this estimated frequency ratio FRP/FRF.

The second locking circuit comprises a frequency-locked loop FLL also comprising the main oscillator OSCP, a reference input to receive the reference signal SRF and configured to receive the content of the storage circuit RG as a control word.

The reference input is the timing input of a flip-flop of a counter CNT2 furthermore receiving the signal SSP.

In the example described here, compatible with NFC contactless communication protocols, the frequency of the signal SH2 is equal to 13.56 MHz and this frequency must also be that of the main clock signal SH1.

Conversely, in the present case, the frequency of the output signal SSP of the main oscillator is chosen as equal to N×13.56 MHz, where N is, for example, equal to 64.

With regard to the frequency FRF of the reference signal SRF delivered by the reference oscillator OSCR, it may be any given frequency but, in practice, it is chosen as between approximately 10 MHz and approximately 100 MHz, for example 18 MHz, without this example being limiting.

With values of 867.84 MHz (64×13.56 MHz) and 18 MHz for the frequency FRP of the signal SSP and the frequency FRF of the signal SRF respectively, the frequency ratio between the frequency FRP and the frequency FRF is consequently equal to 48.2133.

In the present case, whereas the output of the counter CNT1 delivers the phase difference between the signals SH2 and SSP, one of the flip-flops of the counter CNT1 allows the delivery of the signal SH1, the frequency of which is divided by N, for example 64, in relation to the frequency of the signal SSP in such a way as to obtain the frequency of 13.56 MHz.

However, a divider in parallel with the counter CNT1 could also be used to perform this division by N.

Figure 2:
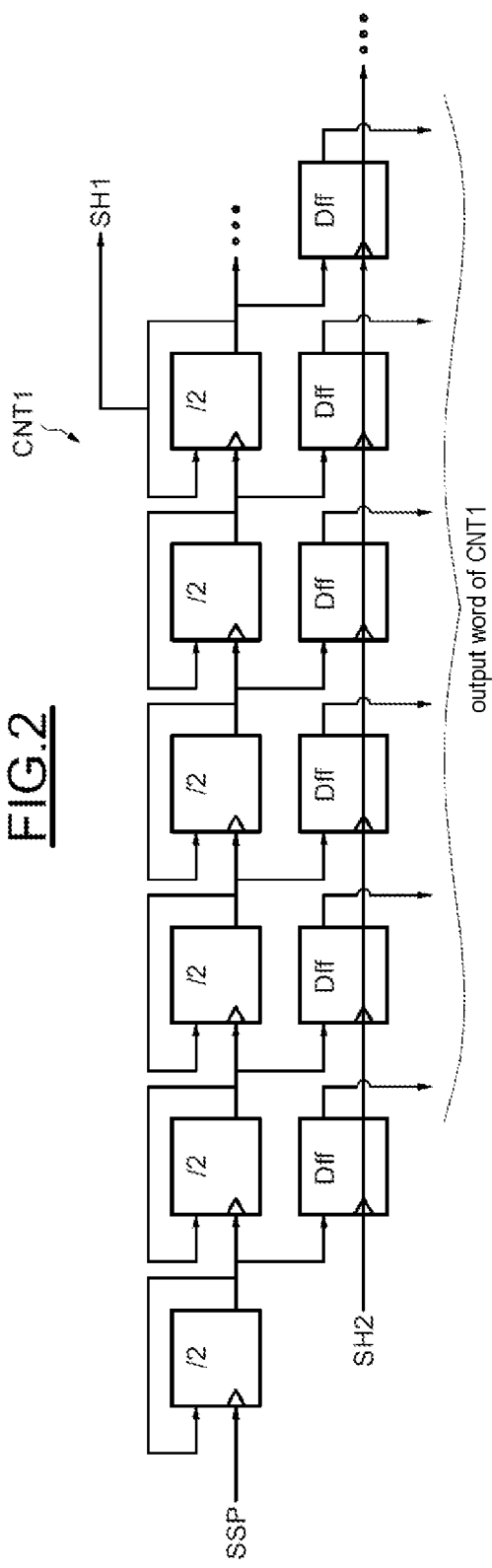

A non-limiting example embodiment of the counter CNT1 is shown in FIG. 2.

The signal SSP originating from the oscillator OSCP increments the counter CNT1 comprising, for example, series-connected dividers by two. The signal SH2 controls flip-flops D denoted Dff which capture the counting result on each edge of the signal SH2.

The output SH1 corresponds to the Nth division of SSP.

Figure 3:
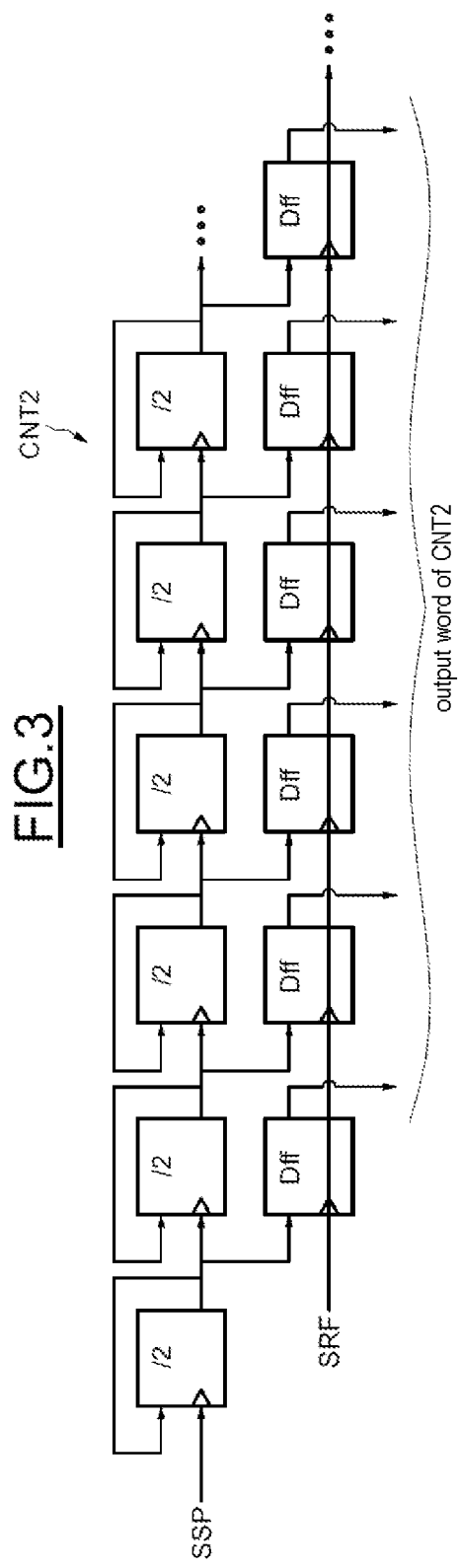

An example embodiment of the counter CNT2 is shown in FIG. 3.

The structure of the counter CNT2 is identical to that of the counter CNT1. Here, the signal SRF controls the flip-flops D denoted Dff which capture the counting result on each edge of the signal SRF. The reference input which receives the signal SRF is the timing input of each flip-flop Dff. The output of the counter CNT2 would already allow the aforementioned frequency ratio to be obtained through successive differences of the results of the counter.

However, in order to estimate this frequency ratio more quickly, it is particularly advantageous to use a processing block BTR allowing the performance of sliding measurements between the frequency of the signal SSP and the frequency of the signal SRF.

Figure 6:
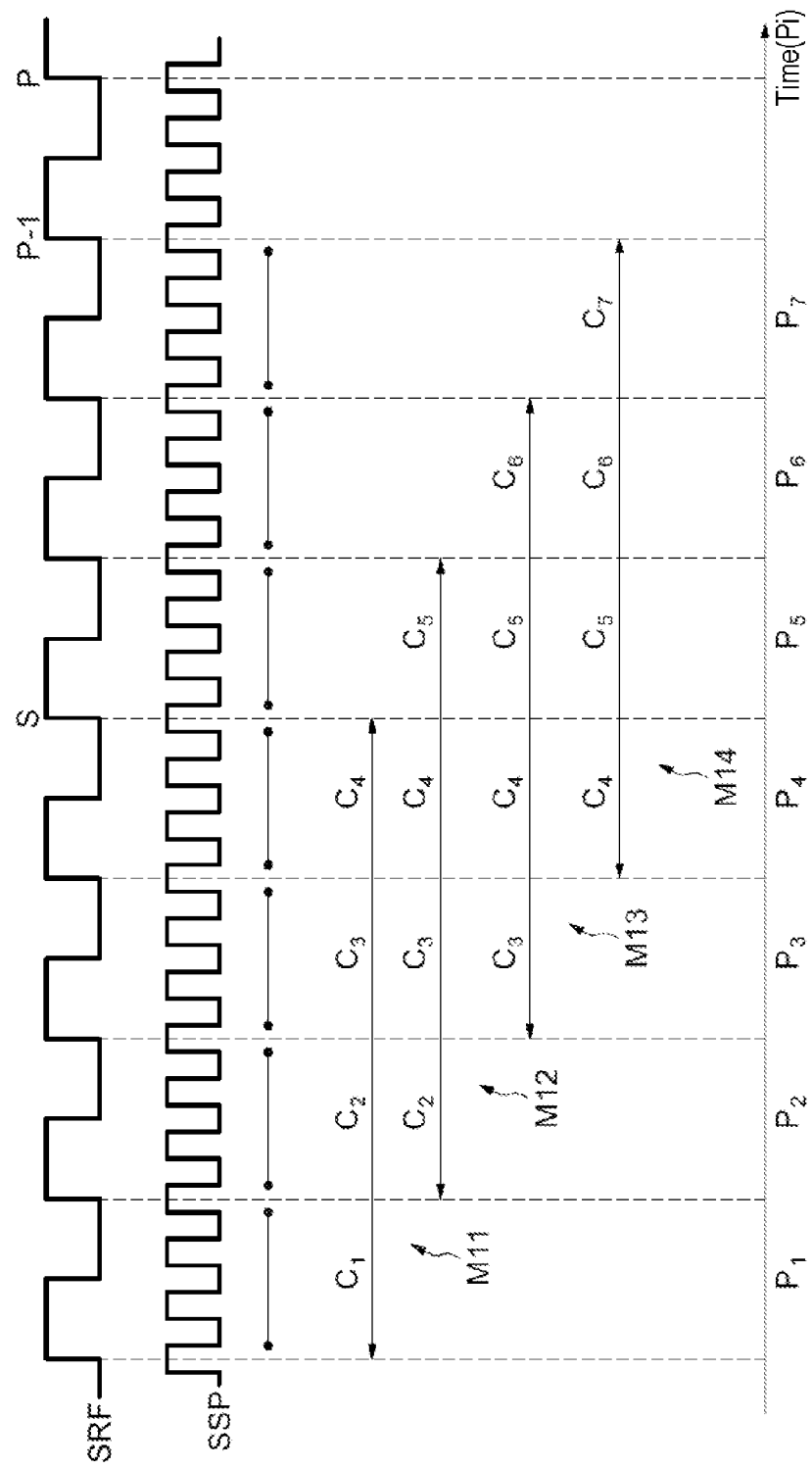

In this respect, the method for determining the frequency of the signal SSP on the basis of the reference signal SRF described in the aforementioned French patent application number 15 61153 can be used, certain characteristics of which are repeated here with reference, more particularly, to FIG. 6.

FIG. 6 shows an example of a method for determining a frequency of the signal SSP on the basis of the reference signal SRF.

In the following description of this figure, the index i will be used to represent the different elements associated with a period $P_i$ of the reference signal. Thus, an index 1 is associated with the period $P_1$, an index 2 with the period $P_2$, etc.

During a first step a) of the method, a counting of a number $C_i$ of whole periods of the signal SSP is performed during a first reference period $P_1$ of the reference signal SRF.

The counting a) is repeated (step b)) for each other successive period $P_i$ of the reference signal SRF during a first quantity S of reference periods $P_i$.

In this example, S=4. The successive counting of the numbers $C_1$, $C_2$, $C_3$ and $C_4$ of whole periods of the first signal SIG taking place in the successive periods $P_1$, $P_2$, $P_3$ and $P_4$ is therefore carried out.

A first mean M11 of the different numbers $C_i$ counted during the four repetitions of the first step a) is then obtained (step c)). In this example, the first mean M11 will be equal to the sum of the numbers $C_1$, $C_2$, $C_3$ and $C_4$, divided by the first quantity S=4.

Steps a) to c) are repeated a number of times equal to the difference between a second quantity P of reference periods and the first quantity S=4 by delaying the start of the counting of a reference period $P_i$ on each repetition.

In this example, P=8. Thus, P−S=4 first means M11, M12, M13 and M14 are obtained, each relating to 4 successive numbers $C_i$.

M11 is therefore the mean of the numbers $C_1$ to $C_4$, M12 the mean of the numbers $C_2$ to $C_5$, M13 the mean of the numbers $C_3$ to $C_6$ and M14 the mean of the numbers $C_3$ to $C_7$.

Finally, a second mean M2 is obtained for the values of the first means M11, M12, M13 and M14.

Here, the value of the second mean M2 is therefore equal to the sum of the first means M11, M12, M13 and M14, divided by P−S=4.

In order to obtain the frequency of the signal SSP, the frequency of the reference signal SRF is then multiplied by the value of the second mean M2.

In other words, the value of the second mean M2 is the frequency ratio FRP/FRF that is to be estimated.

The method carried out in this way is equivalent to the application of the following first formula F1:

$$M2 = \frac{1}{P-S} * \left( \sum_{k=1}^{P-S} \frac{1}{S} \sum_{i=k}^{k+S-1} C_i \right) \quad (F1)$$

This formula could be implemented through software within a microcontroller, for example.

However, the inventors have observed that, by choosing the first quantity S and the second quantity P as being powers of two and, in particular, by choosing =P/2, the method is equivalent to the application of the following second formula F2:

$$M2 = \frac{1}{P-S} * \frac{1}{S} * \left( \sum_{i=1}^{S} i*C_i + \sum_{i=S+1}^{P-1} (P-i)*C_i \right) \quad \text{(F2)}$$

This formula is particularly advantageous since it allows not only the application of the formula with software, but also with simple hardware.

It is then also possible not to repeat the counting of some numbers $C_i$ on each repetition and to retain these numbers $C_i$ so that they can then be weighted.

Now with reference once more to FIG. 1, in order to place the signal generation circuit MGN either in a calibration phase or in a transmission phase, a series of switches SW1, SW2 and SW3 controlled by the control circuit MC are shown here.

The switches are shown here to illustrate functional switching between the different elements. Obviously, there are different possible ways to implement this switching. Transistors can be used or, for example, the operation of some of these circuits can be locked.

Thus, in the calibration phase, the switch SW1 connects the output of the adder ADD3 to the input of the loop filter LPF1, the switch SW3 connects the output of the counter CNT2 to the input of the block BTR and the switch SW2 is open.

Conversely, in the transmission phase, the switch SW1 connects the output of the loop filter LPF2 to the input of the loop filter LPF1, the switch SW3 connects the output of the counter CNT2 to an input of the adder ADD2 via a frequency-measuring circuit MMF and the switch SW2 is closed, connecting the output of the register RG to the other input of the adder ADD2, the output of which is connected to the input of the loop filter LPF2.

The frequency-measuring circuit MMF delivers the current value of the frequency ratio FRP/FRF through successive differences of the counting result supplied by the counter CNT2. However, alternatively, the block BTR could also have been used, which also supplies this current value of the frequency ratio FRP/FRF.

Figure 4:
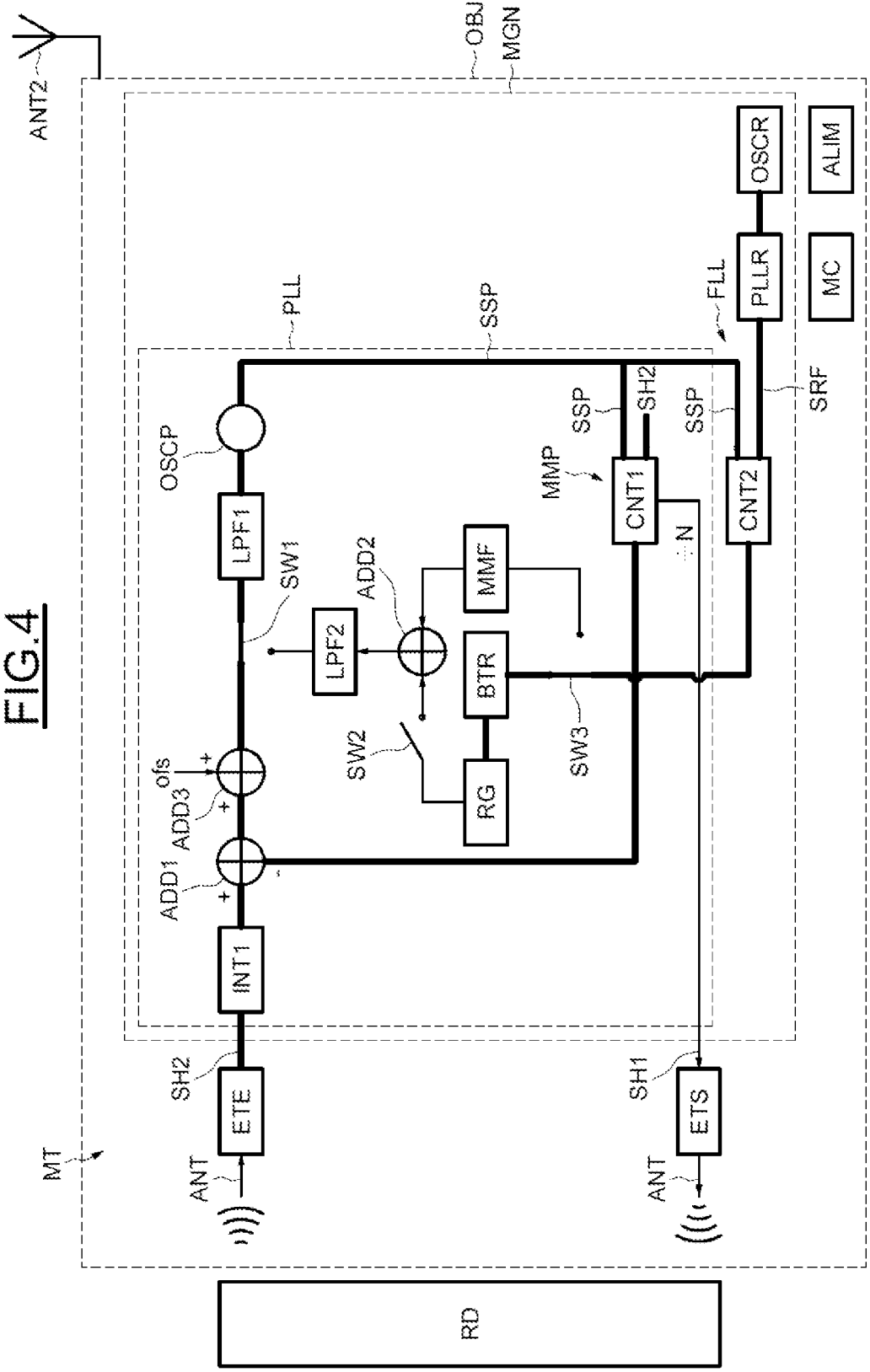
Figure 5:
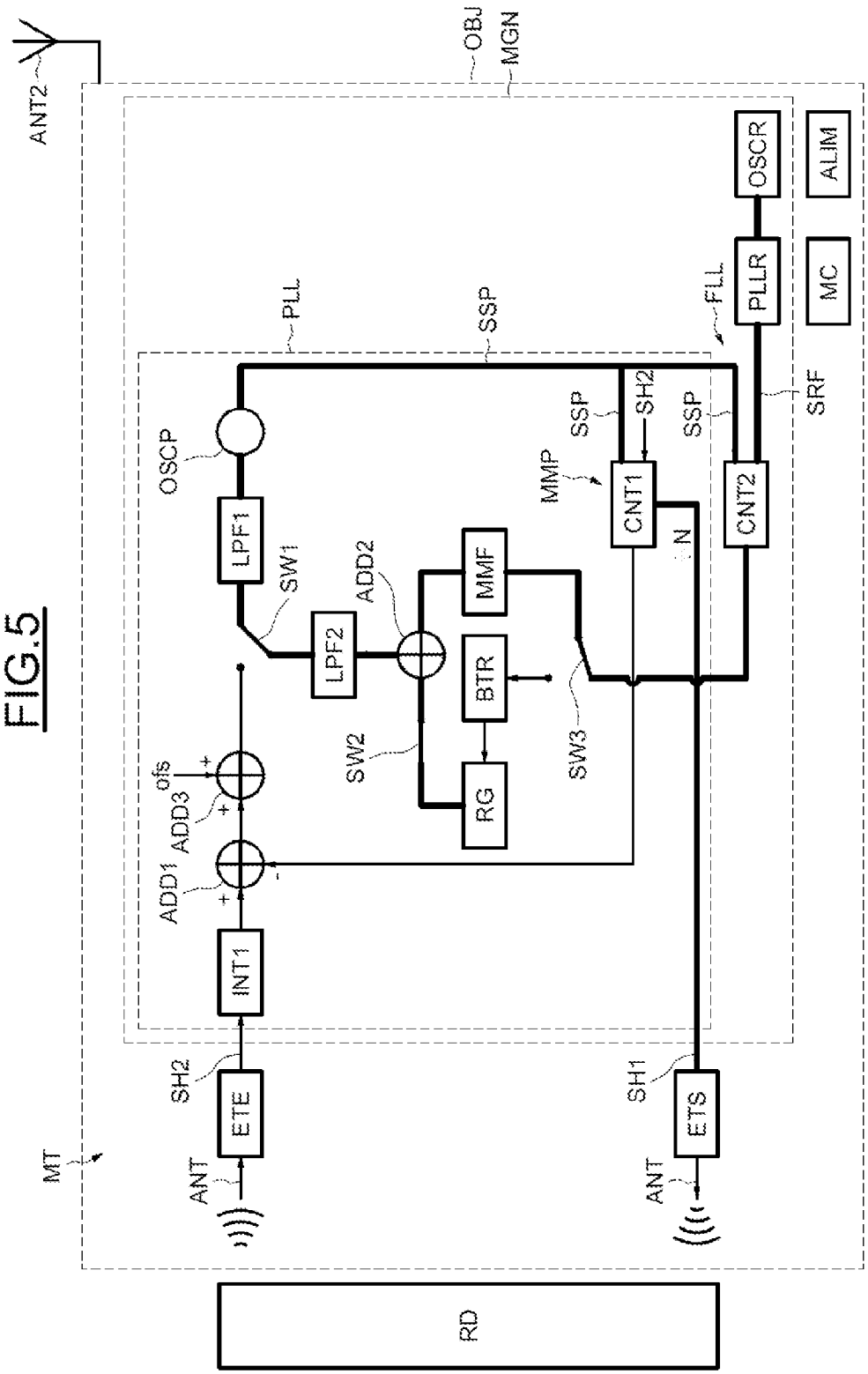

This is shown more particularly in FIGS. 4 and 5.

FIG. 4 shows the situation of a calibration phase in which the object receives, via the antenna ANT2, the secondary clock signal SH2 transmitted by the reader. The phase-locked loop PLL allows a locking of the output signal SSP of the oscillator OSCP onto the phase and frequency of the signal SH2.

Moreover, in parallel, the estimation of the frequency ratio between the frequency FRP of the signal SSP and the reference frequency FRF of the reference signal SRF is performed in the example described here via sliding measurements within the processing block BTR.

The frequency ratio, in this case 48.2133, is stored in the register RG.

Then, as shown in FIG. 5, in the transmission phase, the object transmits, via the antenna, the clock signal SH1 which, as will be seen below, is either amplitude-modulated or phase-modulated.

In this respect, in this transmission phase, the phase-locked loop PLL is activated and allows only a frequency-locking of the output signal SSP of the oscillator OSCP onto the reference frequency of the signal SRF corrected by the estimated frequency ratio and stored in the register RG, which acts as a control word.

Thus, through this frequency-locking alone, the phase of the signal SSP is not modified in relation to the phase locked in the calibration phase by way of the phase-locked loop PLL.

And, through the division by 64, the frequency of the signal SH1 is equal to 13.56 MHz and the response of the object is synchronous with the signal transmitted by the reader.

Figure 7:
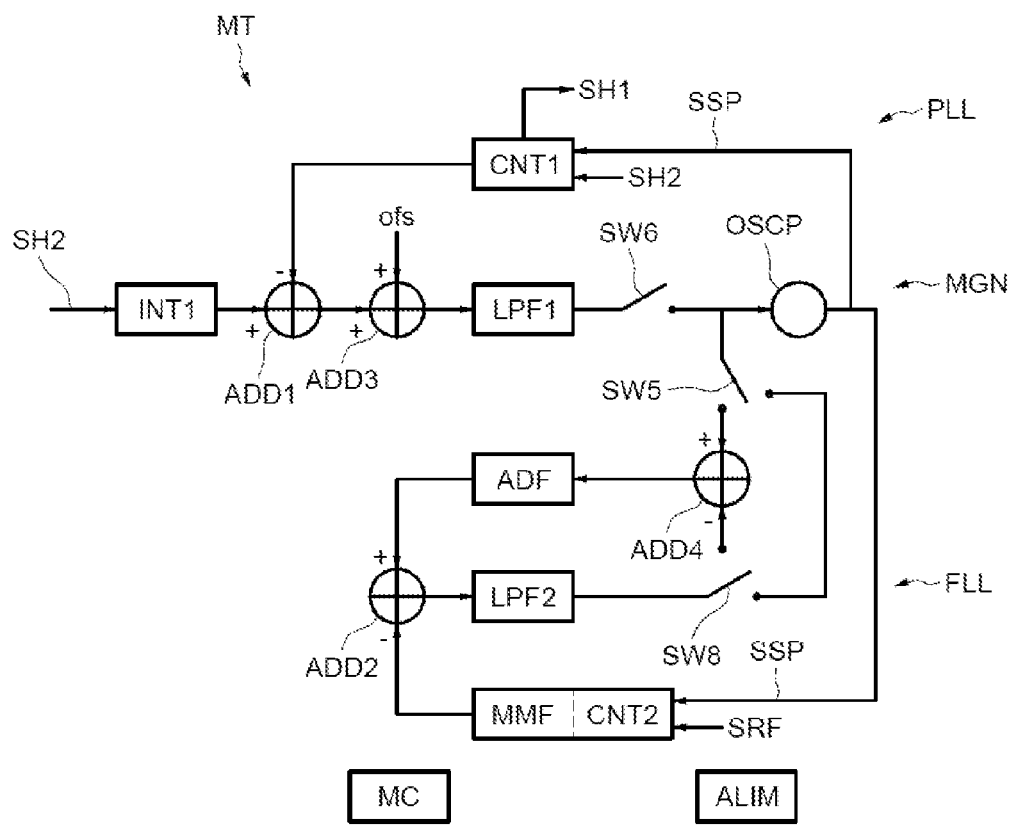
Figure 8:
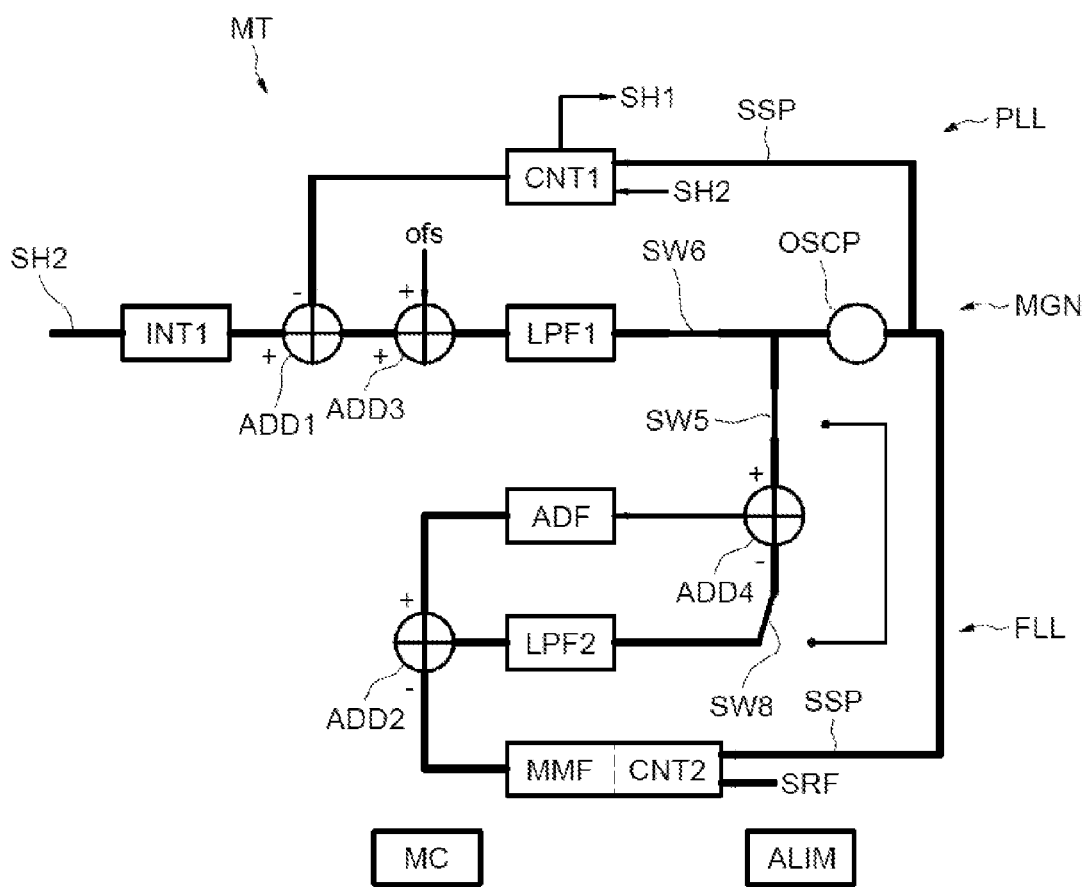
Figure 9:
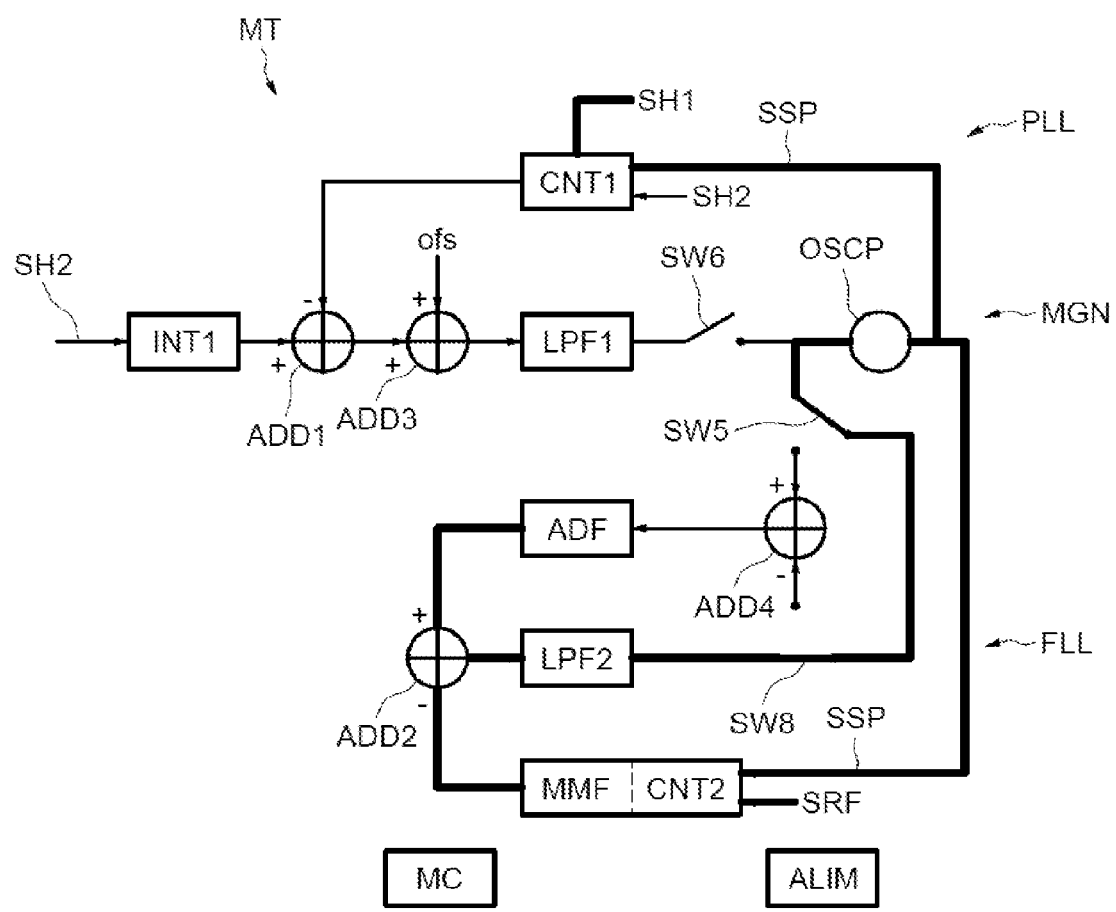

Reference is now made, more particularly, to FIGS. 7 to 9 to illustrate a variant embodiment of the invention.

In this variant, as shown in FIG. 7, the first locking circuit still comprises a phase-locked loop PLL comprising the main oscillator OSCP, a loop filter LPF1 and the counter CNT1.

Conversely, this time, the estimation circuit comprises a frequency-locked loop FLL having a reference input to receive the reference signal SRF (this input reference is the timing input of each flip-flop Dff of the counter CNT2).

The frequency-locked loop FLL also includes a second loop filter LPF2 and a digital adaptive filter ADF connected to the output of the loop filter LPF1 via a switch SW6 and looped back onto the second loop filter LPF2 via an adder ADD2 furthermore receiving the output of the aforementioned frequency-measuring circuit MMF disposed at the output of the counter CNT2 in such a way as to deliver the current value of the frequency ratio FRP/FRF through successive differences of the result of the counting supplied by the counter CNT2.

The output of the loop filter LPF2 is connected to the input of the adaptive filter ADF via another switch SW8 and another adder ADD4.

Furthermore, functionally, the adder ADD4 can be short-circuited by the switches SW6 and SW5 in such a way as to be able to lock the content of the adaptive filter ADF and directly connect the loop filter LPF2 to the input of the main oscillator OSCP.

Here also, the different switches are controlled by the control circuit MC.

The two loop filters LPF1 and LPF2 of the phase-locked loop PLL and the frequency-locked loop FLL are filters which have a conventional structure (typically integrating stabilising filters) and have the same cut-off frequency in such a way that the temporal responses of the two loops are identical.

During the calibration phase, shown in FIG. 8, the two loops PLL and FLL operate simultaneously, but only the phase-locked loop PLL locks the oscillator OSCP.

As a result, the signal SSP of the oscillator OSCP is phase-locked and frequency-locked by the phase-locked loop PLL onto the signal SH2 and, since the two loop filters LPF1 and LPF2 have the same cut-off frequency and since the response of the frequency-locked loop is identical to that of the phase-locked loop, the frequency ratio FRP/FRF between the frequency of the signal SSP and the frequency of the signal SRF is determined by the adaptive filter ADF, the output of this filter ADF acting as a control word for the frequency-locked loop.

At the end of the calibration phase, in the transmission phase (FIG. 9), the control circuit disconnects the main oscillator OSCP from the loop filter LPF1 in such a way as to deactivate the phase-locked loop and the output of the adaptive filter is locked and connected to the frequency-locked loop FLL in such a way as to only frequency-lock the output signal of the main oscillator onto the frequency of the reference signal corrected by the output word of the adaptive filter which again acts as a control word for the frequency-locked loop FLL.

Consequently, the signal SH1 again remains in-phase in relation to the signal SH2.

Figure 10:
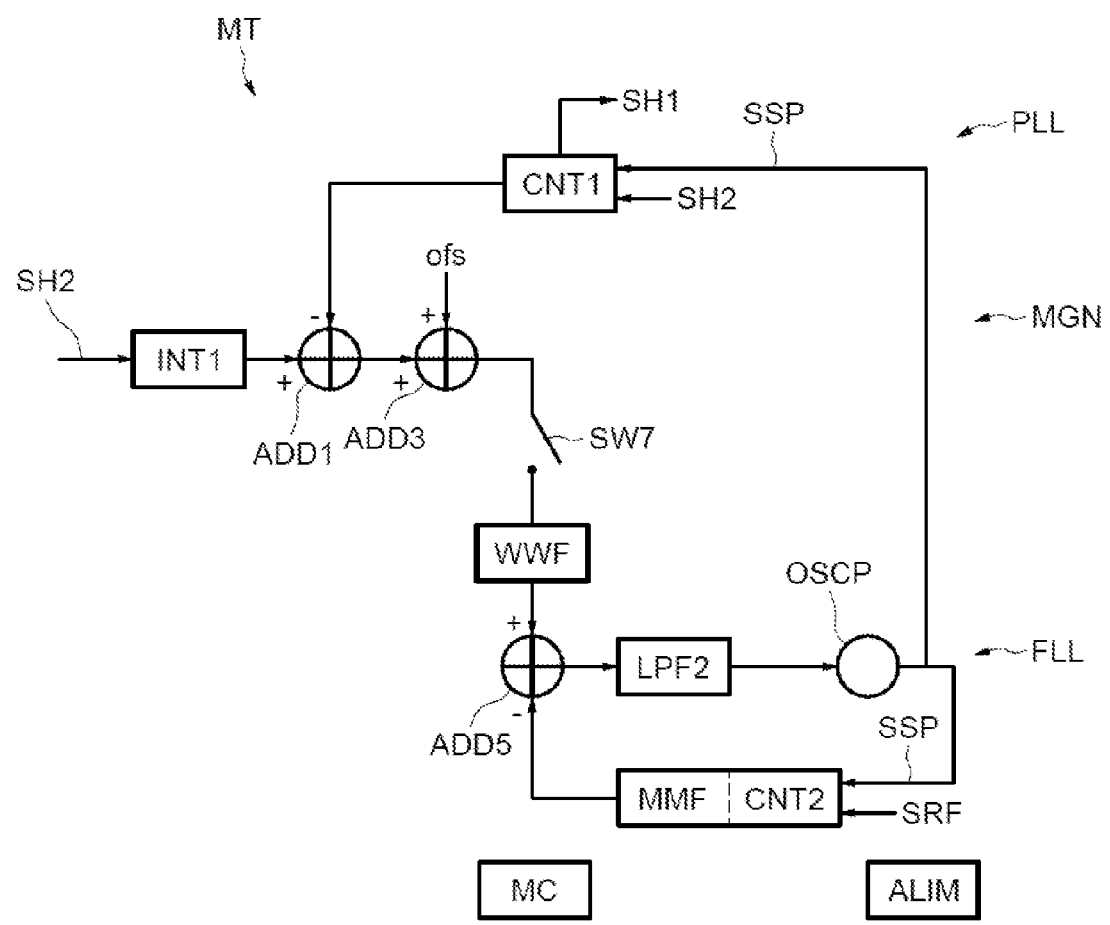
Figure 11:
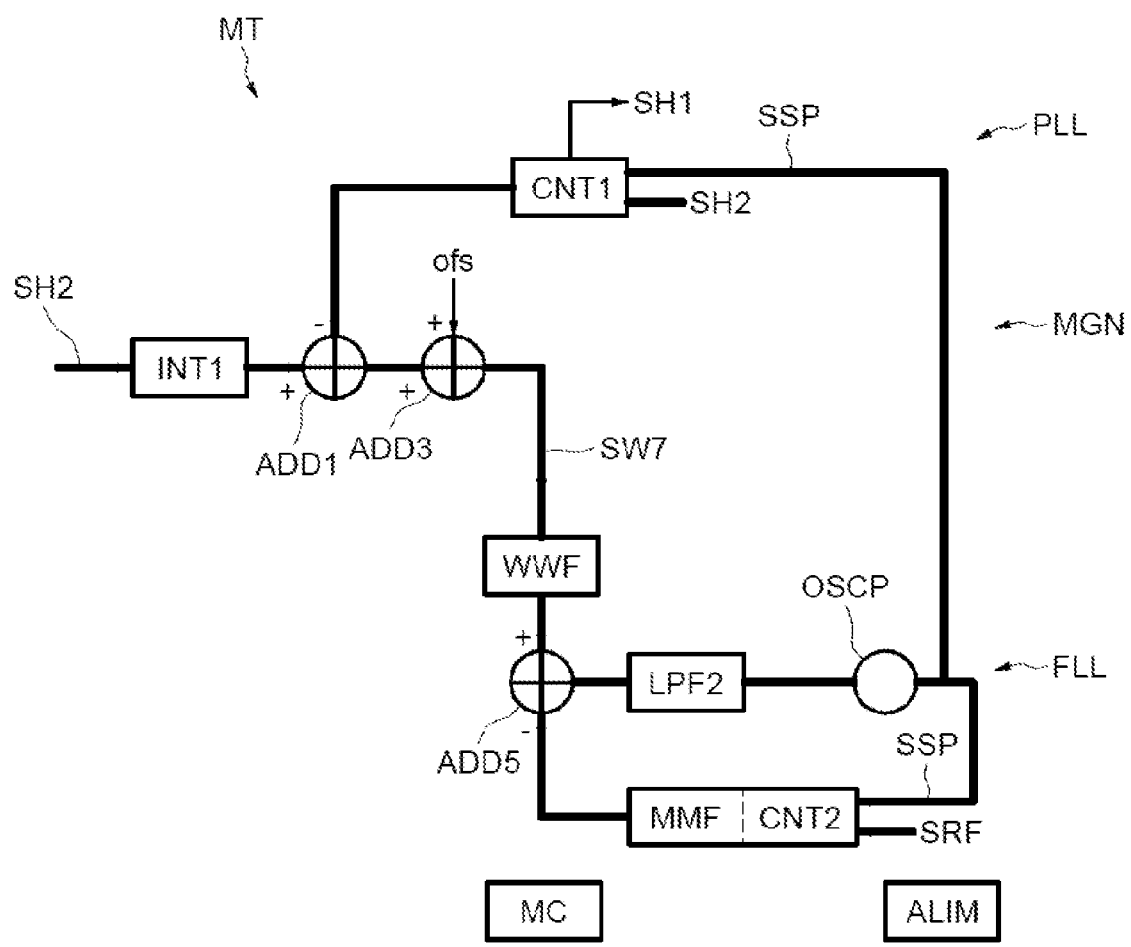
Figure 12:
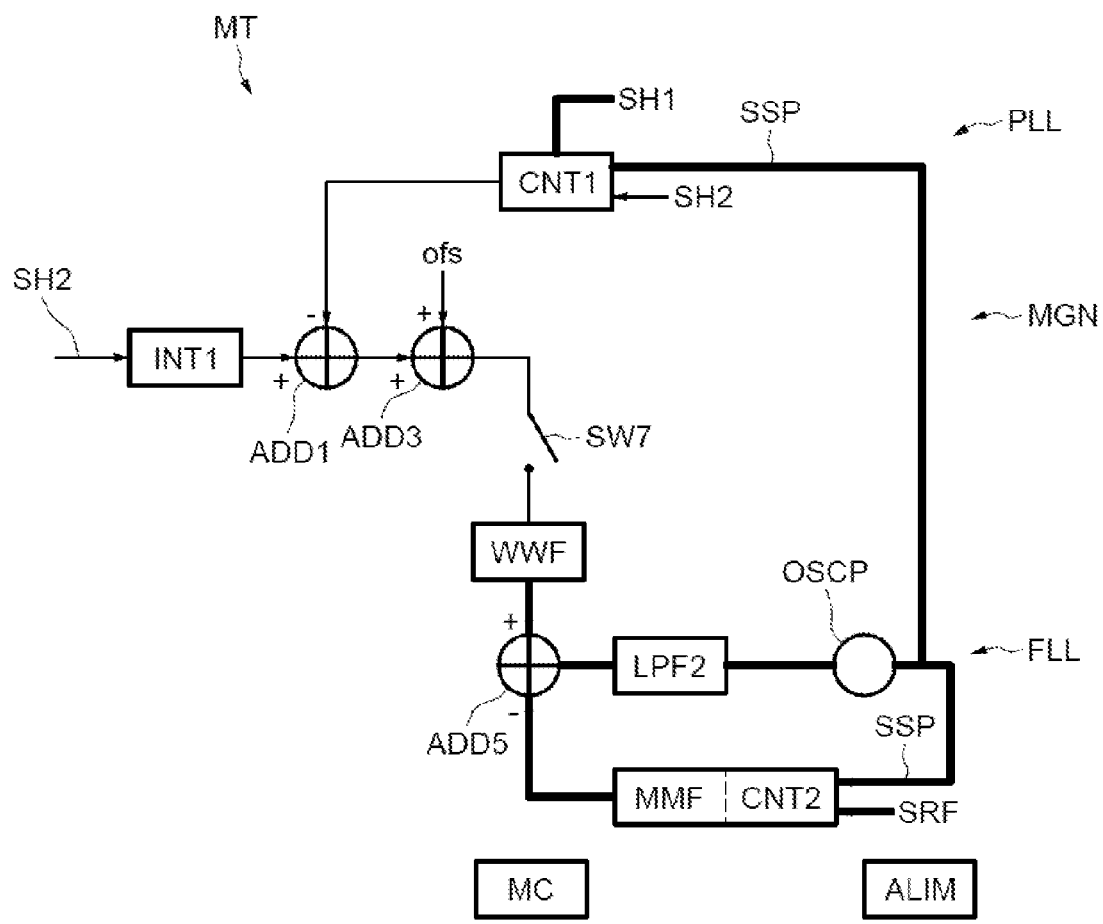

Another possible variant embodiment is shown in FIGS. 10 to 12.

FIG. 10 shows that the first locking circuit still comprises the phase-locked loop PLL which includes the main oscillator OSCP, the estimation circuit again comprises a frequency-locked loop FLL having a reference input to receive the reference signal SRF. Here also, this reference input is the timing input of each flip-flop Dff of the counter CNT2, the output of the counter being connected to the frequency-measuring circuit MMF.

The frequency-locked loop comprises a loop filter LPF2 and an integrating stabilising filter WWF connected to the input of the loop filter via an adder ADD5 furthermore receiving the output of the frequency-measuring circuit MMF incorporating the counter CNT2.

The loop filter of the phase-locked loop PLL comprises this integrating and stabilising filter WWF and also the loop filter LPF2 of the frequency-locked loop.

As shown in FIG. 10, the output of the adder ADD5 can be disconnected from the input of the integrating stabilising filter WWF via a switch SW7 controllable by the control circuit MC.

The calibration phase is shown in FIG. 11.

The locking of the output signal SSP of the main oscillator OSCP during this calibration phase is carried out within the phase-locked loop PLL and the estimation of the frequency ratio is carried out by the complete system (phase-locked loop PLL and frequency-locked loop FLL) using the integrating stabilising filter WWF, the output of which forms a control word for the frequency-locked loop. More precisely, the phase-locked loop causes the system to converge towards the correct frequency ratio. The frequency-locked loop is equivalent here to a low-pass filter and to an integrator (conversion of the frequency to the phase). The phase-locked loop adjusts the control word which tends towards the frequency ratio FRP/FRF.

Once this calibration phase is completed, the transmission phase then follows in which (FIG. 12) the phase-locked loop is opened in such a way as to deactivate it and the output of the integrating stabilising filter is locked and its output is kept connected to the frequency-locked loop such a way as to only frequency-lock the output signal SSP of the main oscillator onto the frequency of the reference signal SRF corrected by the output word of the integrating stabilising filter WWF which is the estimated frequency ratio.

As well as the first communication mode that has just been described, including a calibration phase and a transmission phase, particularly well adapted for long periods of transmission from the object to the reader, it is possible to provide a second communication mode also, usable, for example, for reception of data by the object, but also, more particularly, usable for short periods of transmission from the object to the reader.

This second communication mode thus allows, for example, the alternation of the closures of the phase-locked loop in the absence of transmission and the openings of this loop (freewheeling) during the transmission of the field by the object.

Figure 13:
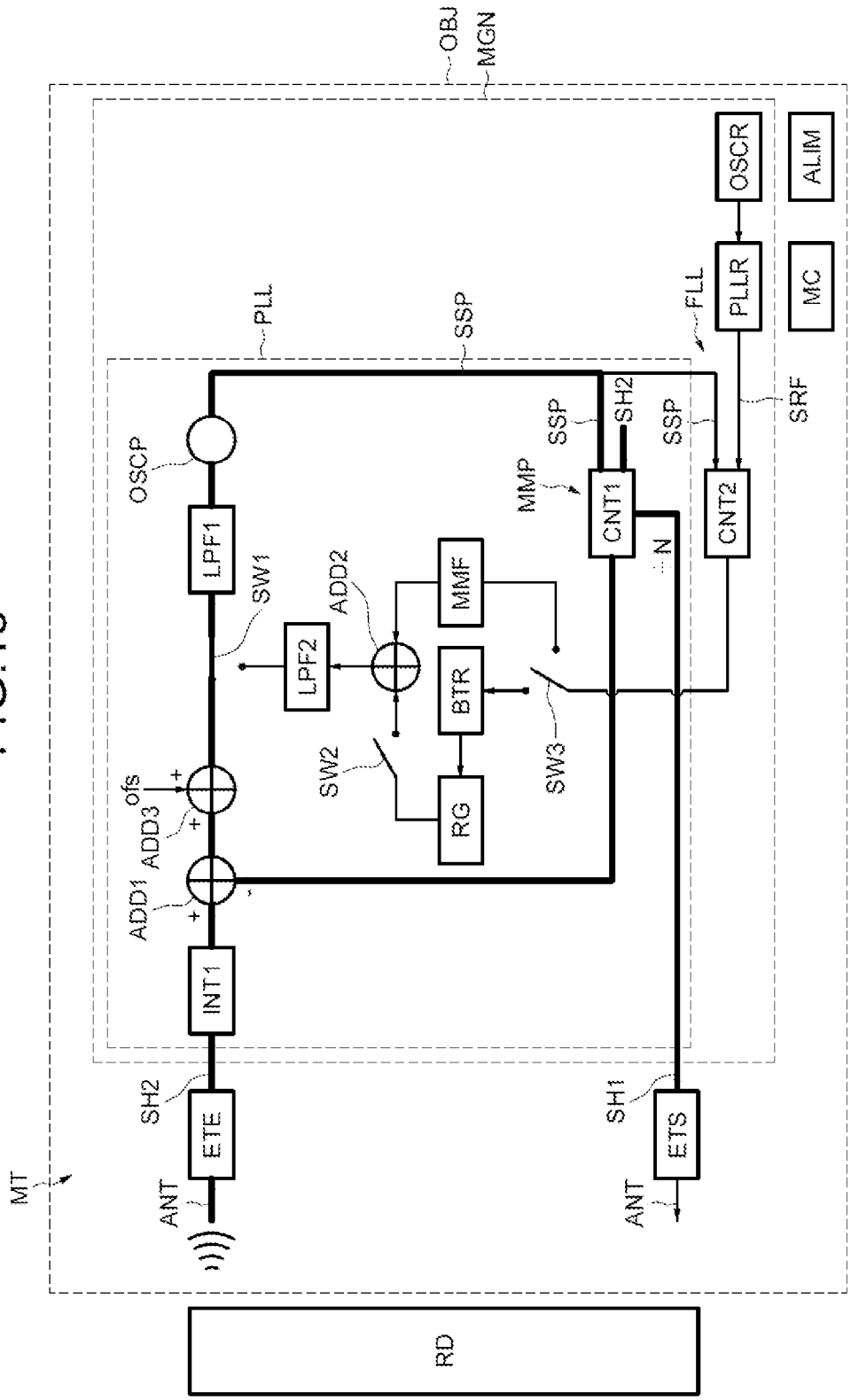
Figure 14:
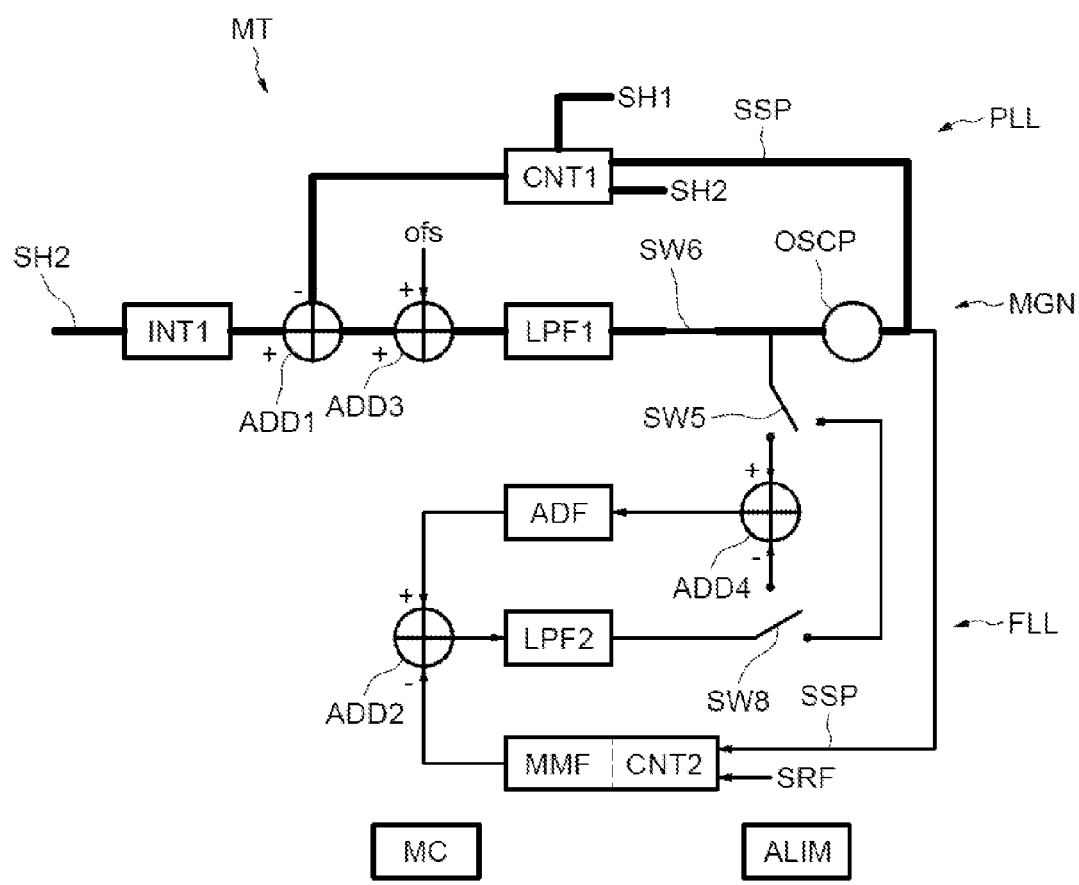
Figure 15:
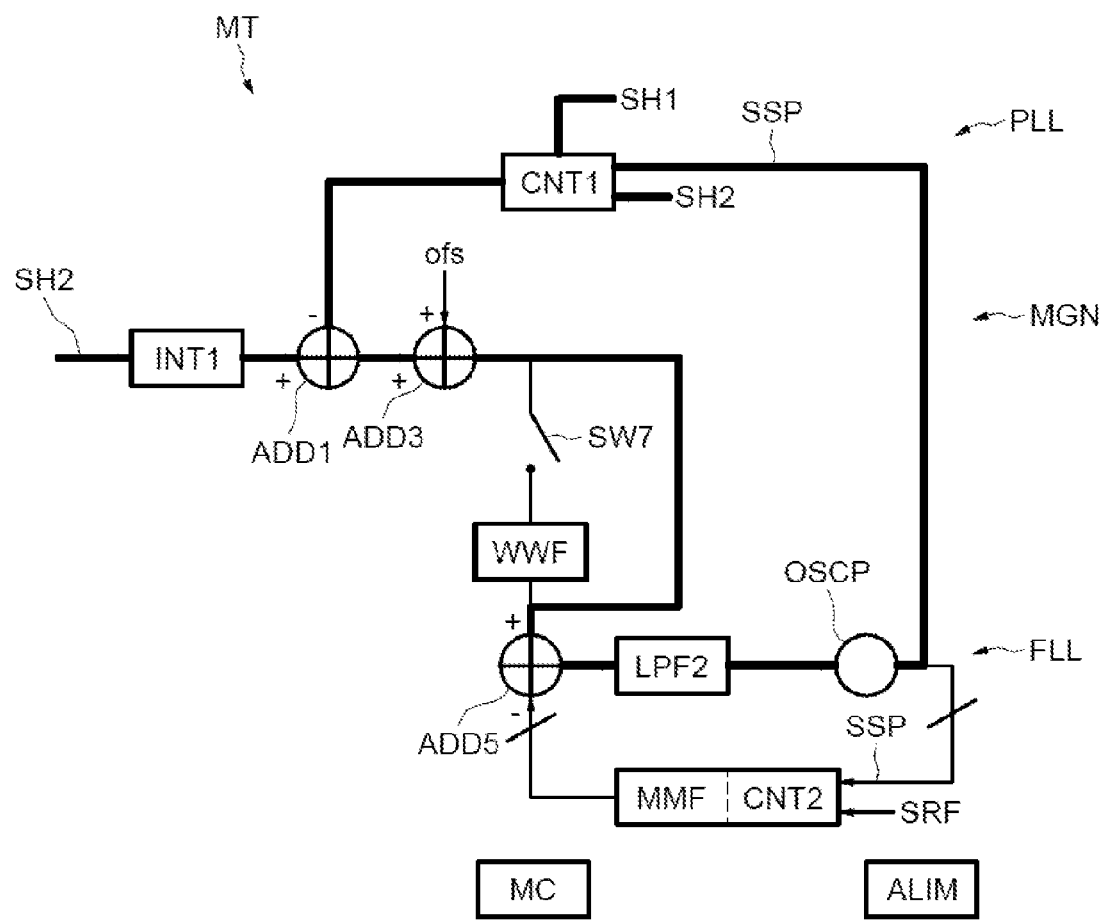

In this case, as shown in FIGS. 13, 14 and 15 relating to the aforementioned three embodiments, the main clock signal SH1 is generated within the object OBJ by carrying out only a locking of the output signal of the controlled main oscillator OSCP onto the phase and frequency of the secondary clock signal SH2 received from the reader.

In practice, the processor MT also comprises a modulator configured to apply a modulation to the generated main clock signal.

Two possibilities are offered here.

Figure 16:
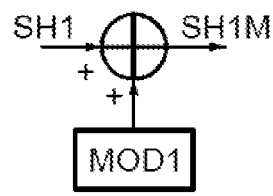
Figure 17:
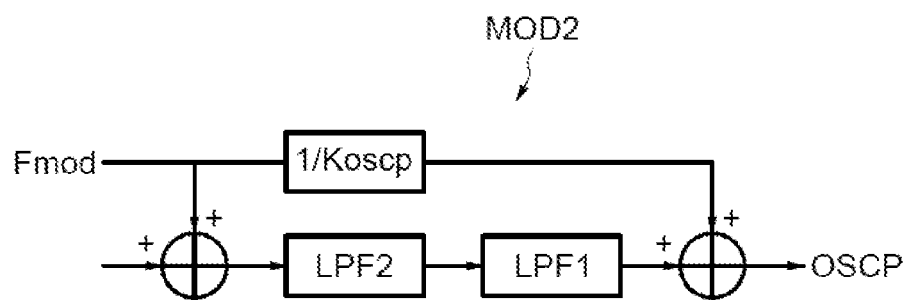
Figure 18:
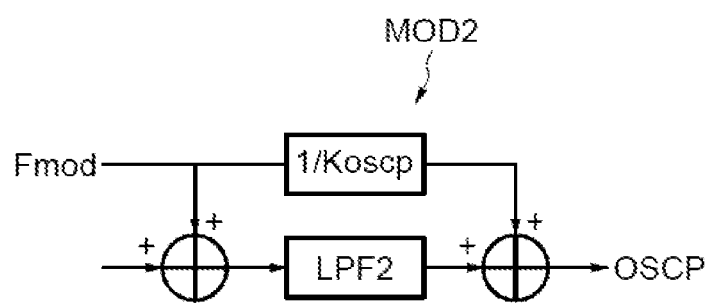
Figure 19:
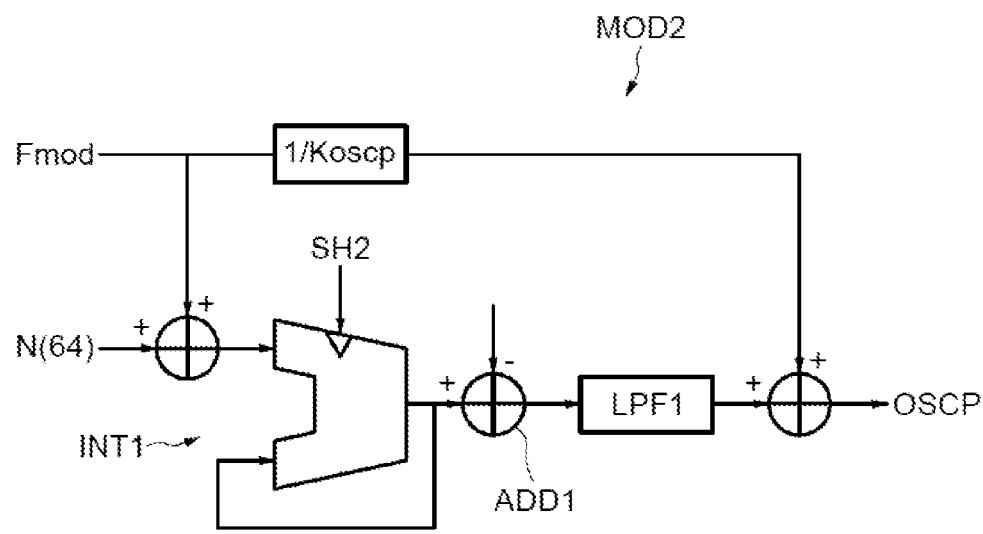
Figure 20:
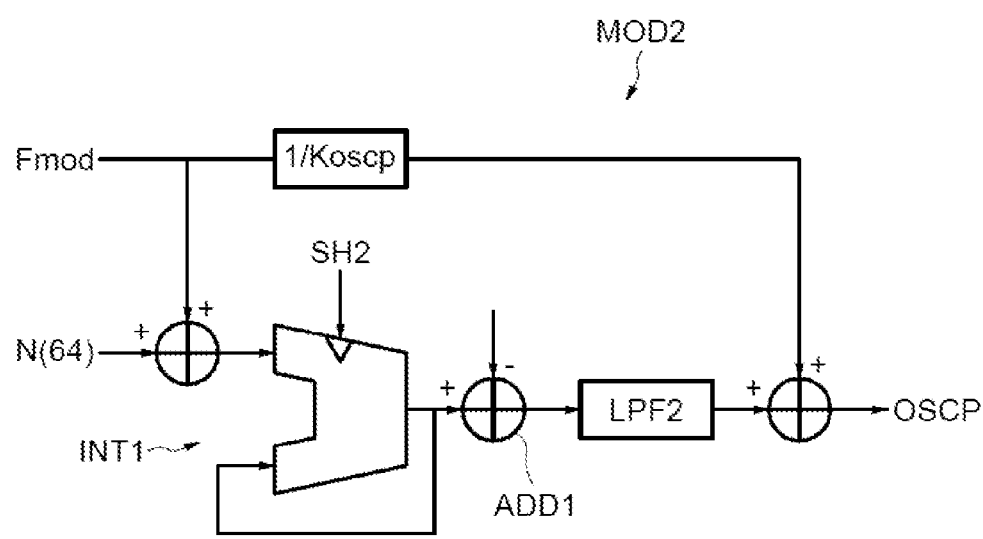

Either an amplitude modulation of the ASK (Amplitude Shift Keying) type is applied, and in this case the modulator MOD1 apply an amplitude modulation to the generated main clock signal SH1 in such a way as to deliver a modulated main clock signal SH1M (FIG. 16).

Another option is to apply a phase modulation of the Phase Shift Keying (PSK) type.

And, in this case, as shown highly schematically in FIGS. 17 to 20, the phase modulator MOD2 is configured to apply the phase modulation before the delivery of the main clock signal SH1.

In other words, the generated clock signal SH1 is then already phase-modulated.

And, in this case, the modulator is configured to inject the phase modulation at two points on either side of the loop filter(s) of the phase-locked loop and/or the frequency-locked loop.

More precisely, as shown in FIGS. 17 to 20, which show the injection points of the modulation in the diagrams shown in FIG. 5, FIGS. 9 and 11, FIGS. 13 and 14 and FIG. 15 respectively, the phase modulation PSK is derived to be expressed as a frequency (Fmod) in order to be homogeneous with the measured word corresponding to the frequency ratio FRP/FRF.

The integration function of the oscillator OSCP allows the phase return and the addition of Fmod at the input of the oscillator OSCP is corrected by the gain Koscp of the oscillator for the modulation.

What is claimed is:

1. A method for contactless communication of an object with a reader using active load modulation, the method including a first communication mode comprising:
    generating a main clock signal within the object, the generating including a calibration phase and a transmission phase;
    wherein the calibration phase comprises locking an output signal of a controlled main oscillator onto a phase and frequency of a secondary clock signal received from the reader and estimating a frequency ratio between a frequency of the output signal of the main oscillator and a reference frequency of a reference signal originating from a reference oscillator; and
    wherein the transmission phase comprises only frequency-locking, without phase locking, the output signal of the main oscillator onto the frequency of the reference signal corrected by the estimated frequency ratio, the main clock signal originating from the output signal of the main oscillator.

2. The method according to claim 1, wherein the estimation of the frequency ratio includes sliding measurements between the frequency of the output signal of the main oscillator and the reference frequency.

3. The method according to claim 1, wherein locking the output signal of the main oscillator during the calibration phase is carried out within a phase-locked loop and estimating the frequency ratio is carried out within a frequency-locked loop.

4. The method according to claim 3, wherein estimating the frequency ratio is carried out within the frequency-locked loop using an adaptive filter connected to an output of a loop filter of the phase-locked loop and looped back onto a loop filter of the frequency-locked loop, an output word of the adaptive filter forming a control word for the frequency-locked loop, the loop filter of the phase-locked loop and the loop filter of the frequency-locked loop having the same cut-off frequency.

5. The method according to claim 4, wherein, during the transmission phase, the loop filter of the phase-locked loop is disconnected from the main oscillator, the output of the adaptive filter is locked and the output signal of the main oscillator is only frequency-locked onto the frequency of the reference signal corrected by the output word of the adaptive filter.

6. The method according to claim 3, wherein estimating the frequency ratio is carried out by a system comprising the phase-locked loop and the frequency-locked loop using an integrating stabilizing filter, an output of the integrating stabilizing filter forming a control word for the frequency-locked loop, the integrating stabilizing filter being coupled to an input of a loop filter of the frequency-locked loop, wherein a loop filter of the phase-locked loop comprises the integrating stabilizing filter and the loop filter of the frequency-locked loop.

7. The method according to claim 6, wherein, during the transmission phase, the phase-locked loop is opened, the output of the integrating stabilizing filter is locked, and the output signal of the main oscillator is only frequency-locked onto the frequency of the reference signal corrected by an output word of the integrating stabilizing filter.

8. The method according to claim 1, wherein the method further comprises a second communication mode comprising generating the main clock signal within the object by only locking the output signal of the controlled main oscillator onto the phase and frequency of the secondary clock signal received from the reader.

9. The method according to claim 1, further comprising generating the main clock signal phase-modulated by way of a phase shift keying.

10. A circuit configured to generate a main clock signal for use in an object capable of contactless communication with a reader by way of active load modulation, the circuit comprising:
a first locking circuit configured to perform a locking of an output signal of a controlled main oscillator onto a phase and frequency of a secondary clock signal received from the reader; an
estimation circuit configured to perform an estimation of a frequency ratio between the frequency of the output signal of the main oscillator and a reference frequency of a reference signal originating from a reference oscillator;
a second locking circuit configured to perform only a frequency-locking, without phase locking, of the output signal of the main oscillator onto the frequency of the reference signal corrected by the estimated ratio; and
a control circuit configured to first activate the first locking circuit and the estimation circuit, and to then activate the second locking circuit.

11. The circuit according to claim 10, wherein the first locking circuit comprises a phase-locked loop comprising the main oscillator;
wherein the estimation circuit is configured to perform sliding measurements between the frequency of the output signal of the main oscillator and the reference frequency;
wherein in the circuit further comprises a storage circuit configured to store the estimated frequency ratio; and
wherein the second locking circuit comprises a frequency-locked loop comprising the main oscillator, a reference input to receive the reference signal, and a second input configured to receive a control word from the storage circuit.

12. The circuit according to claim 10, wherein the first locking circuit comprises a phase-locked loop and the estimation circuit comprises a frequency-locked loop.

13. The circuit according to claim 12, wherein the phase-locked loop of the first locking circuit comprises the main oscillator and a first loop filter;
wherein the frequency-locked loop of the estimation circuit comprises a reference input to receive the reference signal, a second loop filter, and an adaptive filter coupled to an output of the first loop filter and looped back onto the second loop filter, and output word of the adaptive filter forming a control word for the frequency-locked loop; and
wherein a loop filter of the phase-locked loop and the loop filter of the frequency-locked loop have the same cut-off frequency.

14. The circuit according to claim 13, wherein the control circuit is configured to disconnect the main oscillator from the first loop filter in such a way as to deactivate the phase-locked loop, to lock the output of the adaptive filter and to connect the output of the adaptive filter to the frequency-locked loop in such a way as to only frequency-lock the output signal of the main oscillator onto the frequency of the reference signal corrected by the output word of the adaptive filter.

15. The circuit according to claim 13, further comprising a phase modulator configured to apply a phase shift keying modulation before delivering the main clock signal, wherein the phase modulator is configured to inject the phase modulation at two points of the loop filter of the phase-locked loop or at two points of the loop filter of the frequency-locked loop.

16. The circuit according to claim 12, wherein the phase-locked loop of the first locking circuit comprises the main oscillator;
wherein the frequency-locked loop of the estimation circuit has a reference input to receive the reference signal, an integrating stabilizing filter coupled to the input of a loop filter of the frequency-locked loop;
wherein an output of the integrating stabilizing filter forms a control word for the frequency-locked loop; and
wherein the phase-locked loop has a loop filter comprising an integrator and stabilizer and also the loop filter of the frequency-locked loop.

17. The circuit according to claim 16, wherein the control circuit is configured to open the phase-locked loop in such a way as to deactivate the phase-locked loop, to lock the output of the integrating stabilizing filter and to connect the output of the integrating and stabilizing filter to the frequency-locked loop in such a way as to only frequency-lock the output signal of the main oscillator onto the frequency of the reference signal corrected by an output word of the integrating stabilizing filter.

18. The circuit according to claim 12, wherein the control circuit is further configured to activate only the phase-locked loop in such a way as to allow generation of the main clock signal within the object, including only a locking the output signal of the controlled main oscillator onto the phase and frequency of the secondary clock signal received from the reader.

19. The circuit according to claim 10, further comprising an amplitude modulator configured to apply an amplitude modulation to the main clock signal.

20. The circuit according to claim 10, further comprising a phase modulator configured to apply a phase shift keying modulation before delivering the main clock signal.

21. A mobile telephone, comprising:
- a first antenna;
- telephony communications circuitry coupled to the first antenna;
- a second antenna;
- a card-emulation circuit configured to manage contactless communication via the second antenna, wherein the card-emulation circuit comprises:
- a controlled main oscillator;
- a first locking circuit configured to perform a locking of an output signal of the controlled main oscillator onto a phase and frequency of a secondary clock signal received from a reader in near field communication with the card-emulation circuit;
- an estimation circuit configured to perform an estimation of a frequency ratio between the frequency of the output signal of the controlled main oscillator and a reference frequency of a reference signal originating from a reference oscillator;
- a second locking circuit configured to perform only a frequency-locking, without phase locking, of the output signal of the main oscillator onto the frequency of the reference signal corrected by the estimated ratio; and
- a control circuit configured to first activate the first locking circuit and the estimation circuit, and to then activate the second locking circuit.

* * * * *